United States Patent [19]

Palmer

[11] 4,315,366

[45] Feb. 16, 1982

[54] METHOD OF MANUFACTURING MICROMINIATURE SOLID STATE DEVICES

[75] Inventor: Jan T. Palmer, West Wellow, England

[73] Assignee: U.S. Philips Corporation, New York, N.Y.

[21] Appl. No.: 7,854

[22] Filed: Jan. 31, 1979

[30] Foreign Application Priority Data

Feb. 10, 1978 [GB] United Kingdom ............... 05436/78

[51] Int. Cl.³ .......................................... H01R 43/00
[52] U.S. Cl. ...................................... 29/854; 198/381
[58] Field of Search ................. 29/628, 744, 759, 760, 29/589, 590, 591, 464, 281.1, 577 R, 578, 854; 357/74, 27, 79, 80; 269/8; 198/381

[56] References Cited

U.S. PATENT DOCUMENTS

| | | | |
|---|---|---|---|
| 3,243,036 | 3/1966 | Fegley | 29/744 |
| 3,390,450 | 7/1968 | Checki, Jr. et al. | 29/464 X |
| 3,494,024 | 2/1970 | Bock et al. | 29/589 |
| 3,635,730 | 1/1972 | Sweitzer | 427/47 |

FOREIGN PATENT DOCUMENTS 392856 4/1975 U.S.S.R. ................................ 29/589

OTHER PUBLICATIONS

Western Electric Tech. Digest, No. 20, Oct. 1970, pp. 5–6.
Western Electric Tech. Digest, No. 23, Jul. 1971, p. 3.

*Primary Examiner*—Nicholas P. Godici
*Assistant Examiner*—C. J. Arbes
*Attorney, Agent, or Firm*—Thomas A. Briody; Robert T. Mayer; Paul R. Miller

[57] ABSTRACT

A method for manufacturing microminiature solid state devices and apparatus for use in such a method. In various operations, e.g. wire-bonding and die-bonding it is essential to accurately orientate a header of the device. The header (1a) is mounted in a carrier strip (2) and is transported with approximately the desired orientation into the work area (6). Previous mechanical orientation techniques have caused both bending of the lead pins and adhesion between the header and the mechanical elements of the bonding machine. In this method, which is suitable for orientating devices with e.g. a T0.3, T0.5, T0.9 or T0.18 outline, magnetic attraction is used to pull two lead pins (12) against an abutment (14a) so that it becomes correctly orientated. The use of an electromagnet (7), which may be cooled using e.g. a nitrogen jet (17) or a water-cooling jacket (23), facilitates a periodic polarity reversal thus preventing any undesirable permanent magnetization.

18 Claims, 7 Drawing Figures

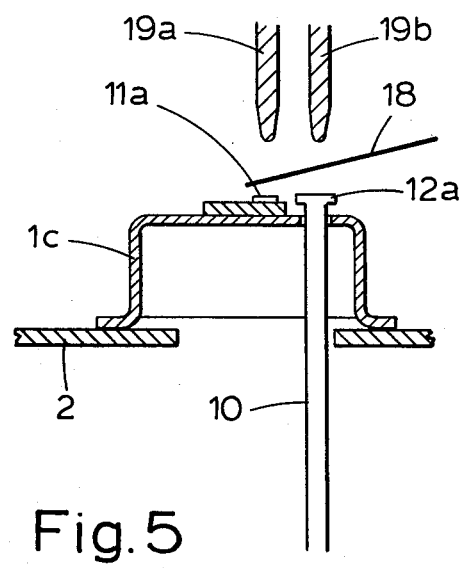
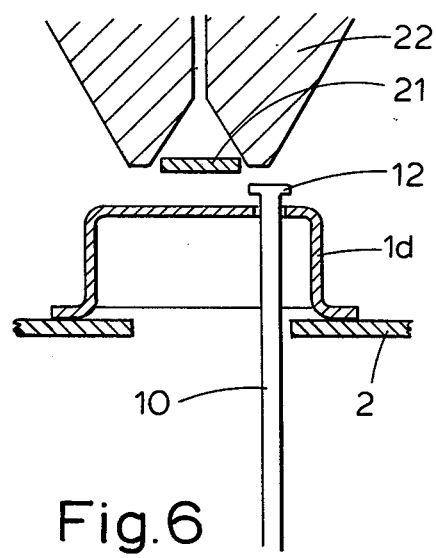
Fig.5
Fig.6
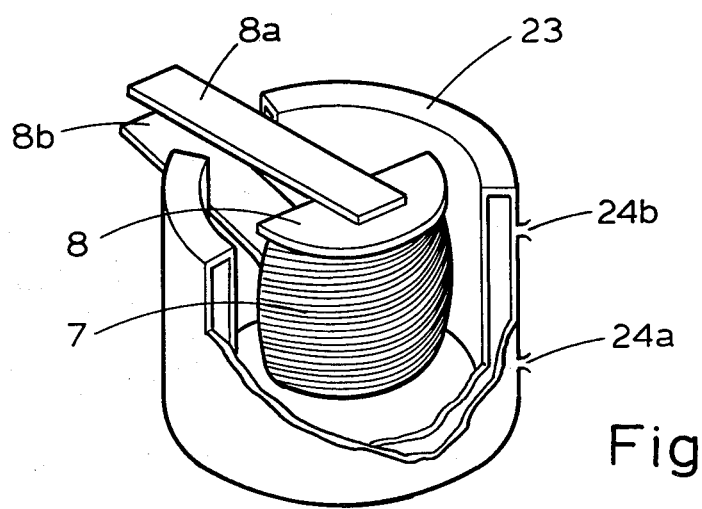
Fig.7

METHOD OF MANUFACTURING MICROMINIATURE SOLID STATE DEVICES

This invention relates to methods for manufacturing a microminiature solid state device, particularly but not exclusively a semiconductor device. The invention further relates to devices manufactured in accordance with such methods and to apparatus for use in these methods.

Well-known microminiature devices are semiconductor devices, for example discrete transistors. Other examples include surface acoustic wave devices.

In the manufacture of microminiature solid state devices there are known techniques which require the accurate orientation of a header of the device. For example, a known technique for making wire connections between a device body and lead pins of a header of the device necessitates the accurate orientation of the header, so that the lead pins and the electrodes of the device body are correctly aligned for the subsequent wire bonding step. Such a technique, is multiwedge wire bonding and is described in U.K. patent specification No. 1,127,439. In this technique the wire bonding step is effected by thermocompression bonding.

In a previously used method of orientation the header is mounted in a carrier strip, which has rectangular holes cut along its length. The holes restrain the header from excessive rotation while allowing it a certain degree of rotational freedom. The lead pins of the header extend through the body of the header to form contact posts above the body and terminal leads below the body. The contact posts have widened heads to form a larger contact area for the lead pins. The header is mounted in the strip in approximately the desired orientation so that all the terminal leads of each header extend through a hole in the strip. The strip is then introduced into the work area of a multiwedge wire bonding machine. When the header has entered the work area a section of a wheel engages the body of the header causing the header to rotate and forcing two contact posts against an abutment, which is positioned so that when the two posts contact the abutment the header is correctly orientated. Alternatively, when the header has entered the work area a tongue engages at least one contact post of the header forcing the header against a wheel. The wheel is free to rotate so that the header is pivoted at the point where the tongue engages the post. The continued force of the tongue against the header and the free rotation of the wheel cause the header to rotate until two contact posts engage the tongue. The header is thus correctly orientated. The header is then firmly clamped prior to the subsequent multiwedge wire bonding step.

These methods present certain disadvantages. Firstly, the tongue engaging the contact posts on the section of the wheel forcing the contact posts against the abutment may cause the contact posts to bend. Thus the lead pins and the electrodes of the device body are no longer correctly aligned and the subsequent bonding step may fail to connect the lead pins with the electrodes.

A further disadvantage results from the contact of the header with the wheel and/or the tongue which tends to collect gold from the header, as the header is usually gold-plated. The combination of the rotation of the wheel and the pressure exerted on the header by the wheel or the tongue may cause the header to adhere to the wheel and/or the tongue and this effect can only be prevented by constantly removing the deposit of gold from the surface of the wheel.

A further disadvantage of these methods is the lack of reliability of the mechanism associated with the wheel or the tongue and consequently the loss of machine operating time caused by maintenance work being carried out on the machine as a result of mechanical failure of the mechanism.

The present invention dispenses with some of the moving parts associated with previous methods and adopts a novel technique for orientating the headers using magnetic attraction.

According to a first aspect of the present invention there is provided a method for manufacturing a microminiature solid state device including the step of orientating a header of the device in which method the header is transported with approximately the desired orientation into a work area, and the header is then accurately orientated in the work area by using magnetic attraction to pull two lead pins of the header against an abutment.

The header has lead pins which extend through the body of the header to form posts above the body and terminal leads below the body. Part of the header is made of a ferromagnetic material and in one specific example of a method in accordance with the invention the lead pins, the posts and the body of the header are made of ferromagnetic material. It is not necessary that all of the terminal leads, the posts and the body be made of a ferromagnetic material.

By using such methods the header may be orientated accurately and reliably in a simple manner. Although the magnetic attraction can be achieved in some cases using a permanent magnet it is generally preferable and particularly advantageous to use an electromagnet and preferably the polarity of the electromagnet is reversed or the electromagnet is demagnetized each time a header is transported into the work area. This polarity reversal or demagnetization prevents the permanent magnetization of parts of the work area. The transportation and orientation of the header is sometimes adversely affected by such a permanent magnetization. The electromagnet can be off during transportation of the header into the work area so as not to disturb the header during transportation. One pole of the magnet is preferably situated at the area of the posts and the opposite pole at the area of the terminal leads, when the header is in the work area. This pole distribution assists in preventing the header experiencing a turning force and thus the header remains in a substantially vertical position.

Methods in accordance with the invention are particularly suitable for the manufacture of devices using T0.3, T0.5, T0.9, T0.18 or other multipin headers, all of which generally have two or more terminal leads and two or more contact posts.

According to a second aspect of the invention there is provided a microminiature solid state device manufactured in accordance with the first aspect of the invention.

According to a further aspect of the invention there is provided apparatus for use in orientating a header in a method of manufacturing a microminiature solid state device, comprising a work area, an abutment for defining a desired orientation of the header when two lead pins of the header are pulled against the abutment and means for producing a magnetic field in the vicinity of the abutment for pulling the two lead pins against the abutment.

Methods in accordance with the invention may be used for a wire bonding stage or for a previous or subsequent stage in the manufacture of semiconductor devices. Such a method may, for example, be employed where a semiconductor device body is to be bonded to a header in an accurately defined orientation.

Embodiments of the invention will now be described, by way of example, and to illustrate these aspects of the invention, with reference to the accompanying drawings, in which:

FIG. 5 is a cross-sectional view of a header in a multiwedge wire bonding machine during a wire bonding stage;

FIG. 6 is a cross-sectional view of a header in a die-bonding machine during a die-bonding stage, and FIG. 7 is a partly cut-away perspective view of an electromagnet enclosed within a water cooling jacket.

Figure 1:
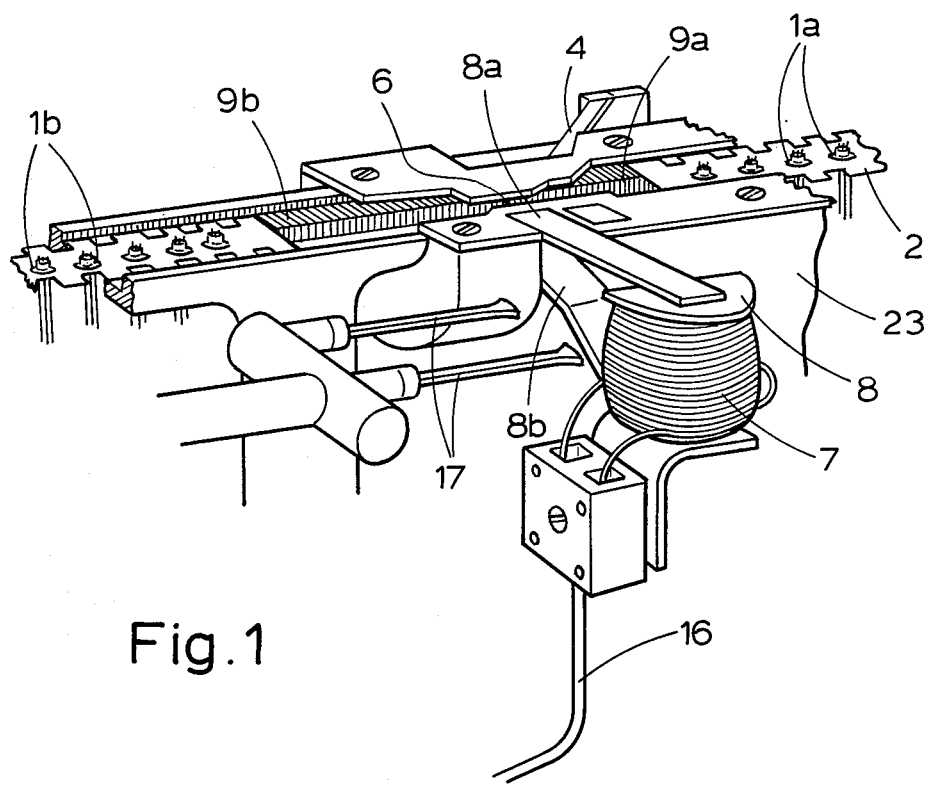
FIG. 1 is a perspective view of the base of a bonding machine with a carrier strip for transporting headers into the work area of the machine in a method in accordance with the invention.

FIG. 1 shows the base section of a bonding machine as used in a wire bonding operation during the manufacture of semiconductor devices, for example, devices having a T0.5 or T0.18 outline. A series of headers 1a, which are to be wire-bonded is mounted in a carrier strip 2. The carrier strip 2 has notches 3 cut along its length which can co-operate with a pawl 4 of an indexing mechanism for moving the carrier strip 2 through the bonding machine along the channels 9a and 9b.

Figure 2:
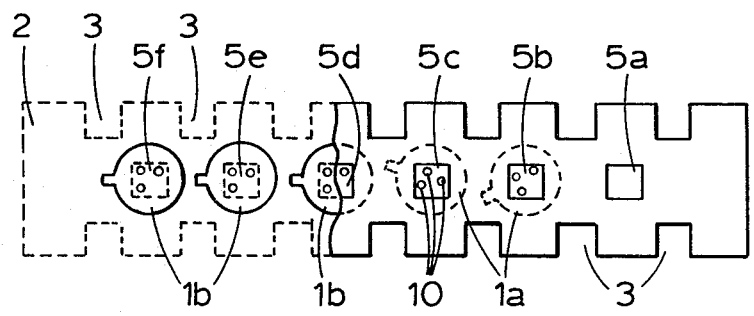
FIG. 2 is a plan view of the carrier strip mounted with headers as seen from the underside of the strip.

FIG. 2 shows a length of the underside of a carrier strip 2, which has rectangular holes 5a to 5f cut along its length. Holes 5b to 5f are mounted with headers 1a and 1b and for clarity the hole 5a is shown vacant. The cut-away section of the carrier strip 2 shows the underside of the headers 1b and the broken outline of the headers 1a and 1b is shown to indicate the orientation of each header. Each header 1a and 1b has three terminal leads 10 which extend through the holes 5b to 5f. The arrangement of the terminal leads 10 is such that they loosely fit into the corners of the holes 5a to 5f as shown by the headers 1b in holes 5d to 5f. Excessive rotation is prevented when the terminal leads 10 abut the edges of the holes 5a to 5f as shown by the headers 1a in slots 5b and 5c. Thus the dimensions of the rectangular holes 5a to 5f with respect to the spacing of the terminal leads 10 determines the amount of rotational freedom of the headers 1a and 1b. In the case of T0.18 headers a square hole with sides of 2.5 mm allows the headers to be easily mounted while limiting the amount of rotation as described. The headers 1a and 1b are mounted in the holes 5b to 5f in approximately the desired orientation for the subsequent bonding stage.

The carrier strip 2 thus mounted is introduced into the machine via the channel 9a (FIG. 1). The pawl 4 of the indexing mechanism engages the notches 3 and the carrier strip 2 progresses along the channel 9a transporting the headers 1a towards the work area 6 of the machine.

The carrier strip 2 passes over an oven 23 which heats the headers 1a to a temperature, which is sufficiently high for a thermocompression bond to be effected at the work area 6 of the machine. This temperature may be as high as 420° C. for multiwedge wire bonding. Although not shown in the drawing the part of the channel 9a above the oven is normally covered.

Figure 3:
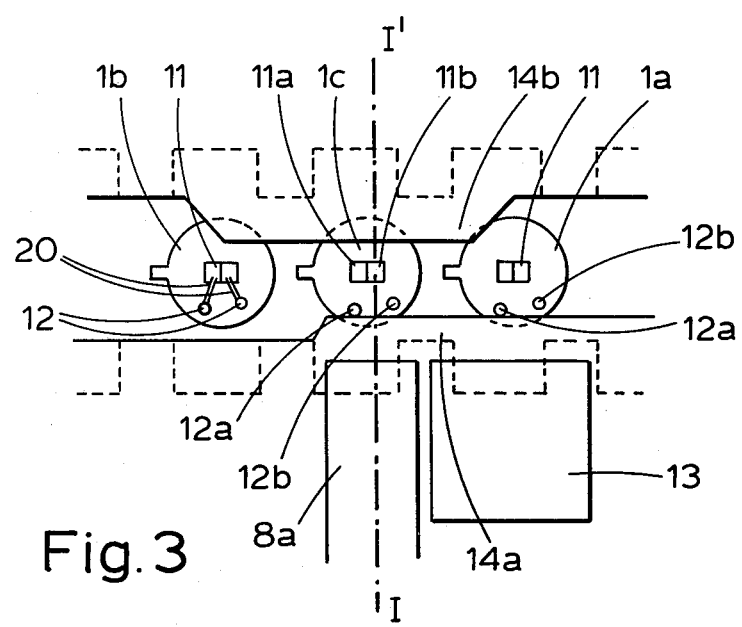
FIG. 3 is a plan view of the work area of the bonding machine and showing a carrier strip mounted with headers.
Figure 4:
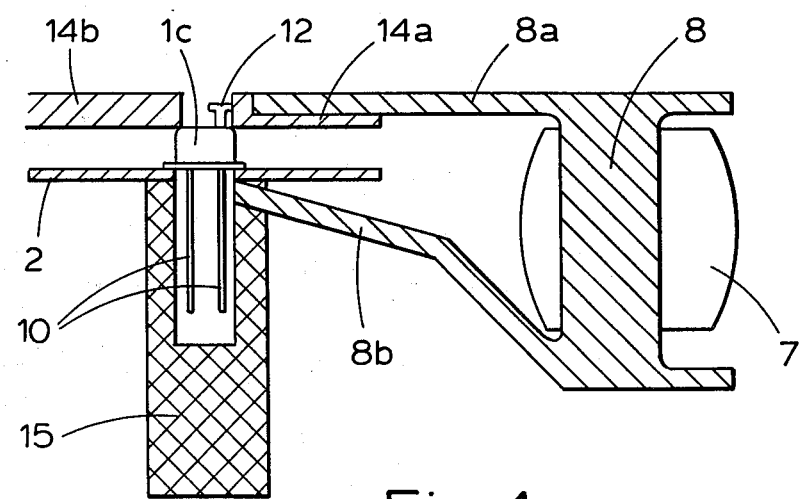
FIG. 4 is a cross-sectional view of the work area of the machine and a header orientated by a method in accordance with the invention taken on the line I–I' of FIG. 3.

FIG. 1 also shows an electromagnet comprising a coil 7 wound onto a soft iron core 8. The poles 8a and 8b of the electromagnet are extended towards the work area 6 of the machine. FIGS. 3 and 4 show how a header 1c is positioned at the work area with respect to the poles 8a and 8b of the magnet. The header 1c has lead pins which extend through the body of the header to form posts 12a and 12b above the body and terminal leads 10 below the body. The posts 12a and 12b, the terminal leads 10 and the body of the header are made of a ferromagnetic material, which may be, for example, a low carbon steel or an alloy of iron, nickel and cobalt having the Trade Mark Fernico. When the header 1c experiences the field of the magnet the pole 8a exerts an attractive force on the posts 12a and 12b of the header 1c and the pole 8b exerts an attractive force on the terminal leads 10 of the header 1c. As the magnetic field is not localised the body of the header also experiences the attractive force of the magnet. The contact posts 12a and 12b are pulled towards an abutment 14a which is positioned so that when the contact posts 12a and 12b engage the abutment 14a the contact electrodes 11a and 11b and the contact posts 12a and 12b are correctly orientated for the subsequent wire bonding step. Because the abutment engages the posts above the header the same abutment 14a may then be used in a subsequent clamping operation. If a header is correctly orientated prior to entering the work area the two contact posts 12a and 12b will experience an equal attractive force and will be pulled against the abutment 14a simultaneously. If, however, the header 1a is approximately in the desired orientation prior to entering the work area as shown in FIG. 3, a first contact post 12a will be pulled against the abutment 14a. The second post 12b will then be attracted towards the pole 8a of the magnet in the continued effect of the field. Thus the first contact post 12a acts as a pivot as the second contact post 12b is pulled against the abutment 14a and the header 1c becomes correctly orientated for the subsequent wire-bonding step. The abutment 14a is made of a non-magnetizable material so that the header does not contact the pole of the electromagnet but can pivot freely to bring both of the posts 12a and 12b into engagement with the abutment 14a.

It has been found advantageous to employ a slab of ferromagnetic material 13 adjacent the pole 8a of the magnet. This causes the magnetic field to be spread to that area immediately outside the work area so that the influence of the magnetic field can be experienced by the next header as it enters the work area of the machine. In this way the orientation becomes a gradual process rather than the discrete application of a magnetic field in the work area. In particular a 10 mm square slab of mild steel has produced desirable results and suitable magnetic field strengths have been obtained using a coil of, for example, 300 to 400 turns of copper wire wound onto a soft iron core and activated with a current of, for example, 1A at 2V D.C. It has been found necessary to reverse the current flow in the coil each time a device is transported into the work area to prevent those parts of the wire bonding machine which are susceptible to magnetization from becoming permanently magnetized. FIG. 1 shows the lead 16 to a cam operated microswitch which reverses the direction of current flow each time another header 1a is transported into the work area 6. The coil 7 of the electromagnet is cooled by a nitrogen jet 17.

When the header 1c has been correctly orientated an air driven clamp 15 engages the underside of the carrier strip 2 in which the header 1c is mounted as shown in FIG. 4. The clamp 15 forces the upper side of the header 1c against the underside of the abutment 14a and against the abutment 14b. Once the header 1c is firmly clamped in position the current flowing in the coil is switched off in preparation for the wire bonding step. The current is not switched on again until the next header is transported into the work area. Thus the header 1c is accurately orientated. FIG. 5 shows the bonding step, where the header 1c is mounted in the carrier strip 2 and a bonding wire 18 is supported above the device body and the contact post 12. The wire bonding is effected by the known technique of multiwedge wire bonding using wedges, for example wedges 19a and 19b, which have fixed positions with respect to each other.

A first wedge is previously aligned with the crosswires of a microscope so that when the first wedge is aligned over one contact area of a correctly orientated device the other wedges become aligned over the other contact areas of the device. Any correctly orientated device may then be viewed through the microscope and the cross-wires need be aligned with only one of the contact areas of the device. Thus the correct orientation of the header allows several wedge bondings to occur simultaneously as all of the wedges become correctly aligned above the contact areas of the device. Similarly, the supported wire 18 is in correct alignment. The wire is bonded between the electrode 11a and the contact post 12 by thermocompression bonding.

The dimensions of the contact areas involved may be approximately 120 micrometers for the diameter of the contact electrodes of the device body and may be 850 micrometers for the diameter of the top of the contact posts, in the case of, for example, T0.18 headers.

FIG. 3 shows a header 1b which has undergone the wire bonding operation and as such wire connections 20 connect the electrodes of device body 11 with the contact posts 12. The carrier strip 2 then leaves the machine via the channel 9b transporting the wire bonded headers 1b away from the work area 6 as shown in FIG. 1.

FIG. 6 shows how methods in accordance with the invention may be used for the orientation of a device header 1d mounted in a carrier strip 2 during a different stage in the assembly of a semiconductor device. In the mounting and attaching of a semiconductor device body 21 to a header 1d it is necessary to accurately position and orientate the device body with respect to the header 1d. A known operation for attaching such a semiconductor device body 21 to a header 1d is called "die-bonding". The headers are mounted in carrier strips and fed into a die-bonding machine which heats the headers up to a temperature as high as 480° C. FIG. 6 shows the header 1d in the work area of the machine. The device body 21 is vacuum held above the header 1d in a die collet 22 until the header 1d is correctly orientated and firmly clamped by methods in accordance with the invention. The device body 21 is then lowered onto the header 1d and bonded to the header 1d in known manner.

FIG. 7 shows how the electromagnet 7 may alternatively be cooled using a water cooling jacket 23 which surrounds the electromagnet 7. The water enters the jacket through the inlet 24a and leaves the jacket through the outlet 24b.

Although a method in accordance with the invention may be used to pull two lead pins of a header against an abutment it is obvious that such a method may also be used to pull more than two lead pins of a header against an appropriately shaped abutment.

The abutment against which the lead pins of the header are pulled need not act exclusively as such an abutment. For example, an edge of a hole 5 in the carrier strip 2 may be used as an abutment for the terminal leads of the header.

I claim:

1. A method for manufacturing a microminiature solid state device comprising the steps of transporting a header of the device into a work area with approximately a desired orientation and accurately orienting said header in said work area by magnetically attracting at least a part of said header and pulling at least two lead pins of said header into engagement with an abutment made of a non-magnetizable material wherein said two lead pins extend through said header to form posts above said header and terminal leads below said header, and a magnet is located at an area adjacent to said posts to provide magnetic attraction with one pole of said magnet being at the area of said posts and an opposite pole of said magnet being at the area of said terminal leads.

2. A method as claimed in claim 1, wherein said abutment engages said posts when said lead pins are pulled against said abutment.

3. A method for manufacturing a microminiature solid state device comprising the steps of transporting a header of the device into a work area with approximately a desired orientation and accurately orienting said header in said work area by magnetically attracting at least a part of said header and pulling at least two lead pins of said header into engagement with an abutment made of a non-magnetizable material, wherein said header is transported into said work area on a carrier strip having a series of holes along the length, and one of said headers is mounted in each of said holes in approximately said desired orientation, said holes restraining said headers from excessive rotation.

4. A method for manufacturing a microminiature solid state device comprising the steps of transporting a header of the device into a work area with approximately a desired orientation and accurately orienting said header in said work area by magnetically attracting at least a part of said header and pulling at least two lead pins of said header into engagement with an abutment made of a non-magnetizable material wherein the magnetic attraction is achieved by an electromagnet having a polarity which is reversible each time a device is transported into said work area.

5. A method for manufacturing a microminiature solid state device comprising the steps of transporting a header of the device into a work area with approximately a desired orientation and accurately orienting said header in said work area by magnetically attracting at least a part of said header and pulling at least two lead pins of said header into engagement with an abutment, wherein after one header is accurately orientated in the work area by magnetic attraction, a clamp forces said header upwards against an underside of said abutment to restrain said header during a subsequent operation, wherein after said clamp forces said header against said abutment, connections of wire are made between posts of said lead pins and a device body present on said header.

6. A method for manufacturing a microminiature solid state device comprising the steps of transporting a header of the device into a work area with approximately a desired orientation and accurately orienting said header in said work area by magnetically attracting at least a part of said header and pulling at least two lead pins of said header into engagement with an abutment, wherein after one header is accurately orientated in the work area by magnetic attraction, a clamp forces said header upwards against an underside of said abutment to restrain said header during a subsequent operation wherein after said clamp forces said header against said abutment, a device body is mounted on and bonded to said header.

7. A method for manufacturing a microminiature solid state device comprising the steps of transporting a header of the device into a work area with approximately a desired orientation and accurately orienting said header in said work area by magnetically attracting with an electromagnet having a polarity which is reversible each time a device is transported into said work area at least a part of said header and pulling at least two lead pins of said header into engagement with an abutment, wherein ferromagnetic material is located adjacent to one pole of said electromagnet causing the magnetic field to be spread over an area immediately outside said work area so that the influence of the magnetic field can be experienced by a header entering said work area.

8. A method as claimed in claim 7, wherein said abutment is made of a non-magnetizable material.

9. A method as claimed in claim 7, wherein said two lead pins extend through said header to form posts above said header and terminal leads below said header, and said abutment engages said posts when said lead pins are pulled against said abutment.

10. A method as claimed in claim 7, wherein said header is transported into said work area on a carrier strip having a series of holes along the length, and one of said headers is mounted in each of said holes in approximately said desired orientation, said holes restraining said headers from excessive rotation.

11. A method as claimed in claim 7, wherein said two lead pins extend through said header to form posts above said header and terminal leads below said header, and a magnet is located at an area adjacent to said posts to provide magnetic attraction with one pole of said magnet being at the area of said posts and an opposite pole of said magnet being at the area of said terminal leads.

12. A method for manufacturing a microminiature solid state device comprising the steps of transporting a header of the device into a work area with approximately a desired orientation and accurately orienting said header in said work area by magnetically attracting at least a part of said header and pulling at least two lead pins of said header into engagement with an abutment, wherein after one header is accurately orientated in the work area by magnetic attraction, a clamp forces said header upwards against an underside of said abutment to restrain said header during a subsequent operation.

13. A method as claimed in claim 12, wherein said magnetic attraction is switched off after said header has been forced against said abutment by said clamp.

14. A method as claimed in claim 12, wherein said abutment is made of a non-magnetizable material.

15. A method as claimed in claim 12, wherein said two lead pins extend through said header to form posts above said header and terminal leads below said header, and said abutment engages said posts when said lead pins are pulled against said abutment.

16. A method as claimed in claim 12, wherein said header is transported into said work area on a carrier strip having a series of holes along the length, and one of said headers is mounted in each of said holes in approximately said desired orientation, said holes restraining said headers from excessive rotation.

17. A method as claimed in claim 12, wherein said two lead pins extend through said header to form posts above said header and terminal leads below said header, and a magnet is located at an area adjacent to said posts to provide magnetic attraction with one pole of said magnet being at the area of said posts and an opposite pole of said magnet being at the area of said terminal leads.

18. A method for manufacturing a microminiature solid state device comprising the steps of transporting a header of the device into a work area with approximately a desired orientation and accurately orienting said header in said work area by magnetically attracting at least a part of said header and pulling at least two lead pins of said header into engagement with an abutment, wherein after one header is accurately orientated in the work area by magnetic attraction, a clamp forces said header upwards against an underside of said abutment to restrain said header during a subsequent operation wherein the magnetic attraction is achieved by an electromagnet having a polarity which is reversible each time a device is transported into said work area.

* * * * *

UNITED STATES PATENT AND TRADEMARK OFFICE
CERTIFICATE OF CORRECTION

PATENT NO. : 4,315,366
DATED : February 16, 1982
INVENTOR(S) : JAN T. PALMER

It is certified that error appears in the above—identified patent and that said Letters Patent is hereby corrected as shown below:

Column 4, Line 22, change "Trade Mark Fernico" to --Trademark FERNICO--.

Column 7, Line 4, after "operation," insert --and--.

Column 7, Line 19 after "operation" insert --,and--.

Column 8, Line 50, after "operation" insert --,and--.

Signed and Sealed this

Tenth Day of August 1982

[SEAL]

Attest:

GERALD J. MOSSINGHOFF

Attesting Officer

Commissioner of Patents and Trademarks